United States Patent
Noh et al.

(10) Patent No.: US 8,362,467 B2
(45) Date of Patent: Jan. 29, 2013

(54) COMPOSITION FOR AN ORGANIC DIELECTRIC

(75) Inventors: Yong-Young Noh, Daejeon (KR); In-Kyu You, Daejeon (KR); Jae Bon Koo, Daejeon (KR); Soon Won Jung, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 224 days.

(21) Appl. No.: 12/769,316

(22) Filed: Apr. 28, 2010

(65) Prior Publication Data

US 2011/0018061 A1 Jan. 27, 2011

(30) Foreign Application Priority Data

Jul. 24, 2009 (KR) .............. 2009-0067819
Nov. 23, 2009 (KR) .............. 2009-0113221

(51) Int. Cl.
*H01L 35/24* (2006.01)
(52) U.S. Cl. ............... 257/40; 257/347; 257/E51.001
(58) Field of Classification Search ............. 257/40, 257/347, E51.001
See application file for complete search history.

(56) References Cited

U.S. PATENT DOCUMENTS

| | | |
|---|---|---|
| 7,029,945 B2 | 4/2006 | Veres et al. |
| 2007/0138463 A1 | 6/2007 | Herlogsson et al. |
| 2008/0191200 A1 | 8/2008 | Frisbie et al. |

(Continued)

FOREIGN PATENT DOCUMENTS

| | | |
|---|---|---|
| EP | 2 073 288 A2 | 6/2009 |
| KR | 2009-0065254 A | 6/2009 |

(Continued)

OTHER PUBLICATIONS

Itoh et al, "Fluorescence Study of Polyelectrolyte Complex Formation III: Mobility of Probes in Microdomains," Polymers for Advanced Technologies, May 1991, vol. 2, pp. 63-69.*

(Continued)

*Primary Examiner* — Anthony Ho
(74) *Attorney, Agent, or Firm* — Rabin & Berdo, P.C.

(57) ABSTRACT

A composition for an organic dielectric, includes a compound represented by Formula 1 below; and a cross-linking agent, wherein, in Formula 1, $R_1$ is any one of hydrogen, hydroxyl group, ester group, amide group, or alkyl group or alkoxy group of a carbon number of 1 to 12, $R_2$ is selected from electrolytic functional groups, each of a and b is a positive integer, and the ratio of b to a (b/a) is larger than 0 and smaller than 99, (Formula 1)

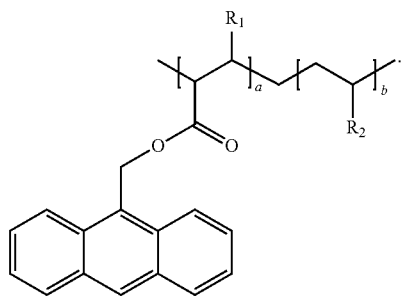

17 Claims, 3 Drawing Sheets

U.S. PATENT DOCUMENTS

2008/0283829 A1  11/2008  Kim et al.
2009/0148717 A1* 6/2009  Jen et al. .................. 428/522
2009/0148787 A1  6/2009  Narita et al.

FOREIGN PATENT DOCUMENTS

KR           10-0909045        7/2009

OTHER PUBLICATIONS

Jung et al., "Pentacene-based thin film transistors with titanium xidepolystyrene/polystyrene Insulator blends: High mobility on high K dielectric film", Appl. Phys. Lett. 90, p. 062111-1-062111-3 (2007).

Herlogsson et al., "Downscaling of Organic Field-Effect Transistors with a Polyelectrolyte Gate Insulator", Advanced Materials, 20, p. 4708-4713(2008).

Said et al., "Polymer Field Effect Transistor Gated VIA a Poly (Styrenesulfonic Acid) Thin film", Applied Physics Letters, vol. 89, p. 143507 (2006).

Tae-Dong Kim, et al., "Click Chemistry" for Highly Efficient Electrooptic Polymers, Macromolecules, vol. 39, No. 5, pp. 1676-1680(2006).

Jeferson Ferreira de Deus, et al., "Nanomechanical properties of poly(methyl methacrylate-co-9-anthryl methyl methacrylate)", Surface and Coatings Technology, Elsevier, Amsterdam, NL, vol. 201, No. 6, pp. 3615-3620(2006).

* cited by examiner

COMPOSITION FOR AN ORGANIC DIELECTRIC

CROSS-REFERENCE TO RELATED APPLICATIONS

This U.S. non-provisional patent application claims priority under 35 U.S.C. §119 of Korean Patent Application Nos. 10-2009-0067819, filed on Jul. 24, 2009 and 10-2009-0113221 filed on Nov. 23, 2009, the entire contents of which are hereby incorporated by reference.

BACKGROUND OF THE INVENTION

The present invention disclosed herein relates to a composition for an organic dielectric and an organic thin film transistor formed using the same.

As electronic apparatuses tend to gain higher multi-functional capabilities, the need for memory devices appropriate for such electronic apparatuses is rapidly increasing. In particular, light-weight and inexpensive memory devices have recently become required for portable electronic apparatuses.

In order to satisfy these requirements, studies have been made on memory devices having properties different from those of typical memory devices. For example, studies are being actively conducted on memory devices using organic materials instead of typical inorganic materials. Memory devices using these organic materials are advantageous in that the devices may be manufactured using inexpensive materials under relatively low-temperature process conditions.

SUMMARY

A composition for an organic dielectric according to embodiments of the present invention includes a compound represented by the following Formula 1 and a cross-linking agent. Where, $R_1$ is any one of hydrogen, hydroxyl group, ester group, amide group, or alkyl group or alkoxy group of a carbon number of 1 to 12, $R_2$ is selected from electrolytic functional groups, a and b is a positive integer, and the ratio of b to a (b/a) may be larger than 0 and smaller than 99.

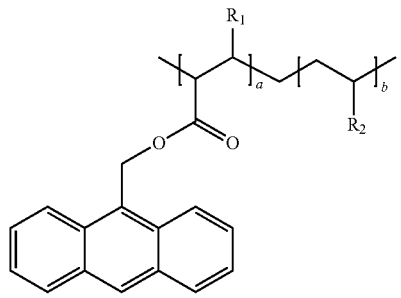

(Formula 1)

In some embodiments, $R_2$ of Formula 1 may be selected from the group consisting of styrene-4-sulfonic acid, sodium 4-styrene-sulfonate, phosphonic acid, and 1-4[4-(3-carboxy-4-hydroxyphenylazo)benzene-sulfonamido]-1,2-ethanediyl.

In other embodiments, the cross-linking agent may include at least one selected from compounds comprising two or more maleimide groups.

In still other embodiments, the cross-linking agent includes at least one selected from the group consisting of Formula 2 to Formula 6. In Formula 2 to Formula 5, each of c, d, e, f, and g is selected from an integer of 2 to 10.

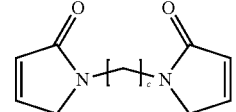

(Formula 2)

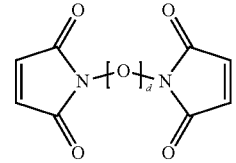

(Formula 3)

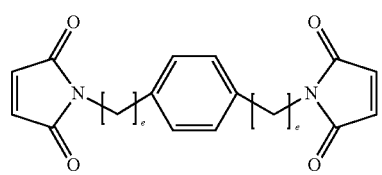

(Formula 4)

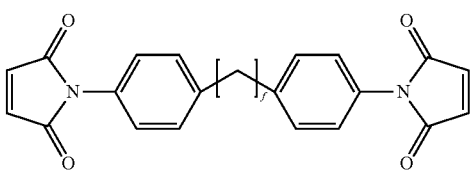

(Formula 5)

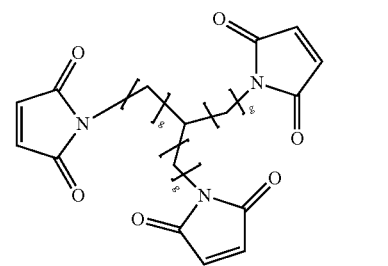

(formula 6)

In even other embodiments, the amount of the cross-linking agent may be in the range of about 10 parts by weight to about 100 parts by weight with respect to 100 parts by weight of the composition.

In yet other embodiments, the composition for an organic dielectric may further include an organic solvent.

In further embodiments, the composition for an organic dielectric may further include a polymerization initiator.

In other embodiments of the present invention, organic thin film transistors may include an organic dielectric including a copolymer formed by cross-linking bonds of polymers having the following Formula 1. In Formula 1, $R_1$ may be any one of hydrogen, hydroxyl group, ester group, amide group, or alkyl group or alkoxy group of a carbon number of 1 to 12, $R_2$ may include at least one selected from electrolytic functional groups, each of a and b may be a positive integer, and the ratio of b to a (b/a) may be larger than 0 and smaller than 99.

In still other embodiments of the present invention, $R_2$ of Formula 1 may be selected from the group consisting of styrene-4-sulfonic acid, sodium 4-styrene-sulfonate, phosphonic acid, and 1-4[4-(3-carboxy-4-hydroxyphenylazo)benzene-sulfonamido]-1,2-ethanediyl.

In even other embodiments of the present invention, the compounds may be cross-linked by a cross-linking agent including two or more maleimide groups.

In yet other embodiments of the present invention, the cross-linking agent may include at least one selected from the group consisting of Formula 2 to Formula 5. In Formula 2 to Formula 6, each of c, d, e, f, and g may be selected from an integer of 2 to 10.

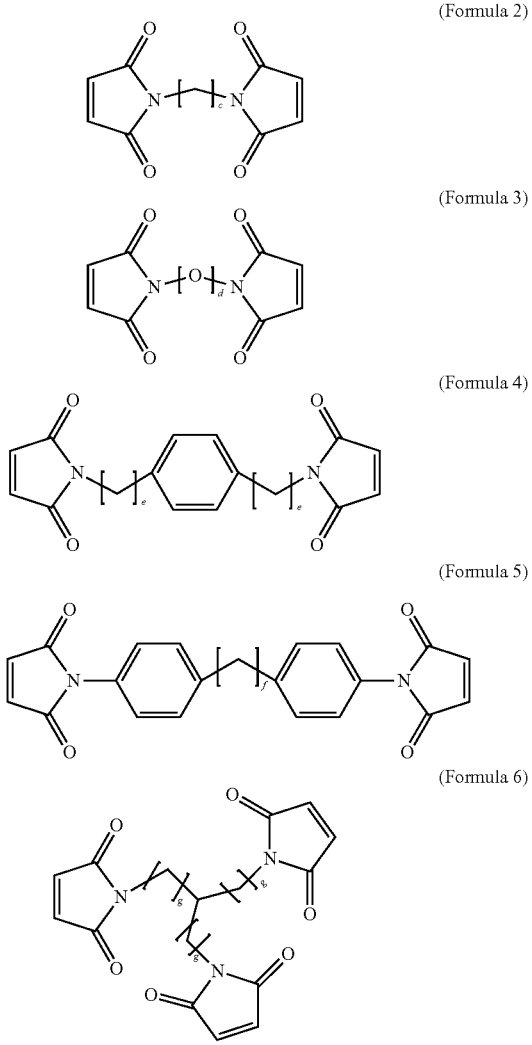

(Formula 2)

(Formula 3)

(Formula 4)

(Formula 5)

(Formula 6)

In further embodiments of the present invention, the organic thin film transistors may further include a substrate, a source electrode and a drain electrode on the substrate, and an active layer on the substrate between the source electrode and the drain electrode. The organic dielectric may be disposed on the active layer.

In still further embodiments of the present invention, a gate electrode may be further disposed on the organic dielectric.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF EMBODIMENTS

Figure 1:
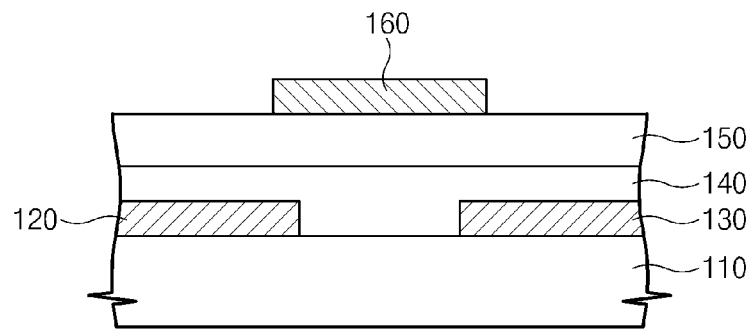
FIG. 1 is a view for explaining an organic thin film transistor according to an embodiment of the present invention.

A composition for an organic dielectric, an organic thin film transistor formed using the same, and a method for forming the same according to preferred embodiments of the present invention will be described below in more detail with reference to the accompanying drawings. Embodiments to be described are provided so that the spirits of the present invention will be easily understood by those skilled in the art, and the present invention will not be limited thereby in any manner. Embodiments of the present invention may be modified in different forms within the spirit and scope of the present invention. In the specification, 'and/or' was used to include at least one of the elements enumerated before and after. In the specification, it will be understood that when an element is referred to as being 'on' another element, it can be directly on the other element, or a third element may be also present on the one element. In the present specification, each element or part was referred to as an expression such as a first, a second, etc., which was used for clarity of illustration and will not be limited to these expressions. In the figures, the thicknesses and relative thicknesses of the elements may be exaggerated for clarity of illustration. Further, formulas and equations presented are exemplified to clearly express embodiments of the present invention, and the formulas and equations may be modified within the spirit and scope of the present invention.

1. Composition for Organic Dielectric

Hereinafter, a composition for an organic dielectric and a method for forming the same according to embodiments of the present invention will be described. The composition for an organic dielectric may include compounds having an anthracenyl group. For example, the composition for an organic dielectric may include compounds having the following Formula (1).

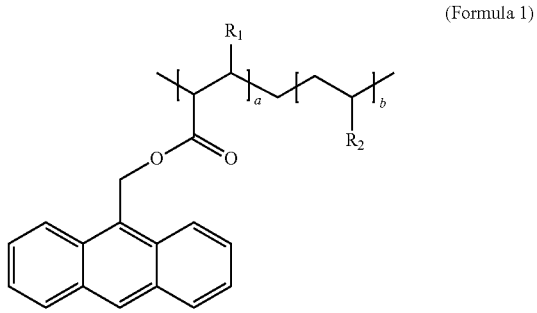

(Formula 1)

In Formula 1, $R_1$ may be any one of hydrogen, hydroxyl group, ester group, amide group, or alkyl group or alkoxy group of a carbon number of 1 to 12.

$R_2$ in Formula 1 may be at least one selected from electrolytic functional groups. For example, $R_2$ may be one selected from functional groups which ions, for example, hydrogen ion ($H^+$), sodium ion ($Na^+$), or chlorine ion ($Cl^-$) may be dissociated from. The ions may be dissociated by an electric field. Specifically, $R_2$ in Formula 1 may be selected from the group consisting of styrene-4-sulfonic acid, sodium 4-styrene-sulfonate, phosphonic acid, and 1-4[4-(3-carboxy-4-hydroxyphenylazo)benzene-sulfonamido]-1,2-ethanediyl. In Formula 1, each of a and b is a real number ($0.01<a, b<0.99$). The sum of a and b is 1.

The compound of Formula 1 may function as an electrolyte due to $R_2$ in Formula 1. Specifically, when an electric field is applied to an organic dielectric including the compound of Formula 1, the ions may be dissociated from $R_2$. Accordingly, the compound represented by Formula 1 may function as an electrolyte in an organic dielectric which will be subsequently described.

The composition for an organic dielectric may include a cross-linking agent. The cross-linking agent may cross-link anthracenyl groups of the compounds of Formula 1. The cross-linking agent may have two or more maleimide groups. For example, the cross-linking agent may be selected from the group consisting of Formula 2 to Formula 6.

In Formula 2 to Formula 6, each of c, d, e, f, and g may be selected from an integer of 1 to 10.

The composition for an organic dielectric may further include an organic solvent. The organic solvent may be selected from various organic solvents including tetrahydrofuran (THF), acetone, and chloroform. The organic solvent may be determined according to a ratio of a unit in the compound of Formula 1. For example, the organic solvent may be selected according to the ratio (a in Formula 1) of a unit including an anthracenyl group and $R_1$ and the ratio (b in Formula 1) of a unit including a maleimide group and $R_2$ in Formula 1.

The composition for an organic dielectric may further include a polymerization initiator. The polymerization initiator may be an additive which initiates a polymerization between the anthracenyl group in Formula 1 and the maleimide group of the cross-linking agent. For example, the polymerization initiator may be a radical polymerization initiator.

2. Method for Forming a Composition for an Organic Dielectric

The composition for an organic dielectric may be formed by using first monomers including an anthracenyl group. The second monomers may include at least one selected from electrolytic functional groups. For example, $R_2$ may include any one selected from functional groups in which hydrogen ions ($H^+$), sodium ions ($Na^+$), or chlorine ions ($Cl^-$) can be dissociated from $R_2$. The ions may be dissociated by an electric field. For example, the second monomer may include a functional group selected from the group consisting of styrene-4-sulfonic acid, sodium 4-styrene-sulfonate, phosphonic acid, and 1-4[4-(3-carboxy-4-hydroxyphenylazo)benzene-sulfonamido]-1,2-ethanediyl.

The first monomers and the second monomers are dissolved in a first organic solvent to form a first mixed solution. The first organic solvent may be selected from various organic solvents including THF, acetone, and chloroform.

The contents of the first monomer and the second monomer may be controlled by considering properties of the organic solvent used and a copolymer obtained by the first monomers and the second monomers. For example, as the contents of the first monomers increase, a copolymer to be polymerized by the first monomers and the second monomers may become softer.

A polymerization initiator is added to the first mixed solution. A polymerization between the first monomers and the second monomers is initiated by the polymerization initiator. A compound having the following Formula 1 may be formed by the polymerization.

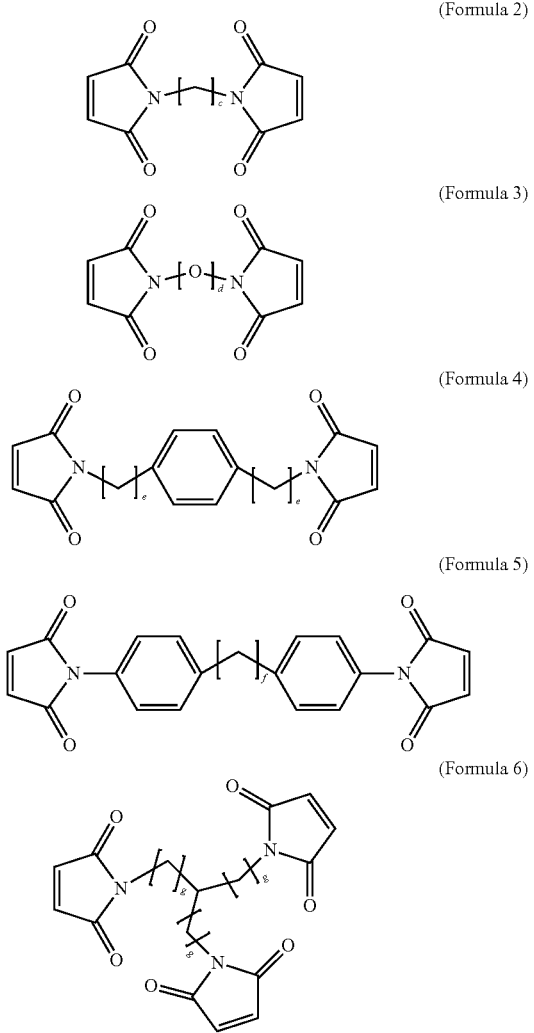

(Formula 2)

(Formula 3)

(Formula 4)

(Formula 5)

(Formula 6)

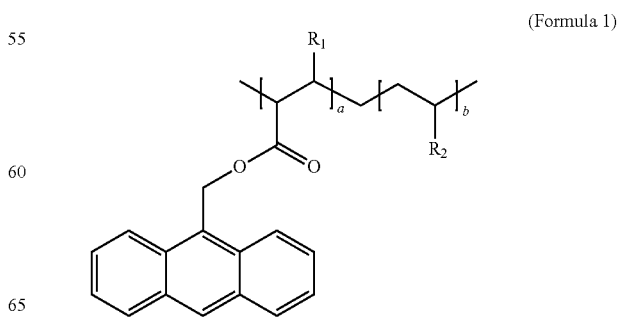

(Formula 1)

In Formula 1, $R_1$ may be is any one of hydrogen, hydroxyl group, ester group, amide group, or alkyl group or alkoxy group of a carbon number of 1 to 12. That is, $R_1$ may be a functional group of the first monomer.

$R_2$ in Formula 1 may be at least one selected from electrolytic functional groups. For example, $R_2$ may be any one selected from functional groups in which ions, for example, hydrogen ions ($H^+$), sodium ions ($Na^+$), or chlorine ions ($Cl^-$) can be dissociated from $R_2$. The ions may be dissociated by an electric field. Specifically, $R_2$ in Formula 1 may be selected from the group consisting of styrene-4-sulfonic acid, sodium 4-styrene-sulfonate, phosphonic acid, and 1-4[4-(3-carboxy-4-hydroxyphenylazo)benzene-sulfonamido]-1,2-ethanediyl. That is, $R_2$ may be a functional group of the second monomer.

The compound of Formula 1 may function as an electrolyte due to $R_2$ in Formula 1. Specifically, when an electric field is applied to an organic dielectric including a compound of Formula 1, the ions may be dissociated from $R_2$. Accordingly, a compound represented by Formula 1 may function as an electrolyte in an organic dielectric formed using the same.

The compound of Formula 1 is dissolved in a second organic solvent to form a second mixed solution. The first organic solvent may be selected from various organic solvents including dichloroethane and trichloroethane.

A cross-linking agent is added to the second mixed solution. A composition for an organic dielectric may be thereby formed. The compound of Formula 1 and the cross-linking agent may be dissolved in the second organic solvent in an amount of about 1% by weight to about 30% by weight of a solid content.

The cross-linking agent may include two or more maleimide groups. For example, the cross-linking agent may be selected from the group consisting of Formula 2 to Formula 6. Each of c, d, e, f, and g in Formula 2 to Formula 6 may be an integer of 1 to 10.

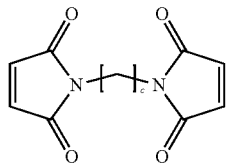

(Formula 2)

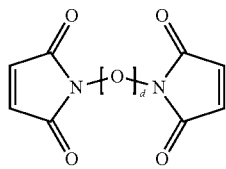

(Formula 3)

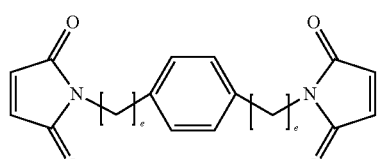

(Formula 4)

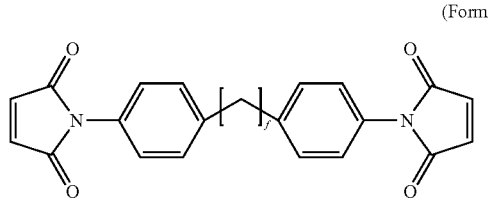

(Formula 5)

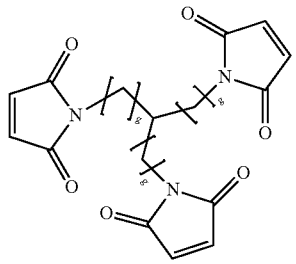

(Formula 6)

The amount of the cross-linking agent may be in the range of about 10 parts to about 100 parts by weight with respect to 100 parts by weight of the compound of Formula 1.

3. An Organic Transistor Including an Organic Dielectric and a Method For Forming the Same Referring to FIG. 1, an organic thin film transistor using the composition for an organic dielectric and a method for forming the same will be described.

A source electrode 120 and a drain electrode 130 may be formed on a substrate 110. The source electrode 120 and the drain electrode 130 may include metal, conductive metal compound, or conductive polymer. For example, the source electrode 120 and the drain electrode 130 may include at least one selected from the group consisting of metal including Au, Ag, Al, and Ni, conductive metal compound including indium tin oxide (ITO), and conductive polymer including polyethylenedioxythiophene: polystyrene sulfonate (PEDOT: PSS), polypyrrole, and polyaniline.

An active layer 140 may be formed on the substrate 110. The active layer 140 may be formed between the source electrode 120 and the drain electrode 130 and may extend on the source electrode 120 and the drain electrode 130. When an organic thin film transistor is operated, a channel may be formed in the active layer 140 between the source electrode 120 and the drain electrode 130.

The active layer 140 may include at least one selected from the group consisting of polythiophene and derivatives thereof, triisopropylsilyl pentacene (TIPS pentacene) and derivatives thereof, thieno thiophene and derivatives thereof, pentacene precursor and derivatives thereof, α-6-thiophene and derivatives thereof, polyfluorene and derivatives thereof, pentacene and derivatives thereof, tetracene and derivatives thereof, anthracene and derivatives thereof, perylene and derivatives thereof, rubrene and derivatives thereof, cororene and derivatives thereof, phenylene tetracarboxylic diimide and derivatives thereof, polyparaphenylenevinylene and derivatives thereof, polythiophenylnylene and derivatives thereof, α-5-thiophene
and derivatives thereof, oligothiophene and derivatives thereof, phthalocyanine and derivatives thereof, and naphthalene tetra carboxylic acid diimide and derivatives thereof.

An organic dielectric 150 may be formed on the active layer 140. Forming the active layer 150 may include applying the above-described composition for the organic dielectric on the active layer 140 and heating the composition for the organic dielectric. The composition for the organic dielectric may be applied on the active layer 140 by various coating methods including spin coating, drop casting, and inkjet printing. The applied composition for an organic dielectric may be heated at about 95° C. to about 115° C. The compounds of Formula 1 in the composition for an organic dielectric may be cross-linked with a cross-linking agent by the heating. For example, a reaction between the compound of Formula 1 and the cross-linking agent may be expressed as the following Reaction Formula 1.

(Reaction Formula 1)

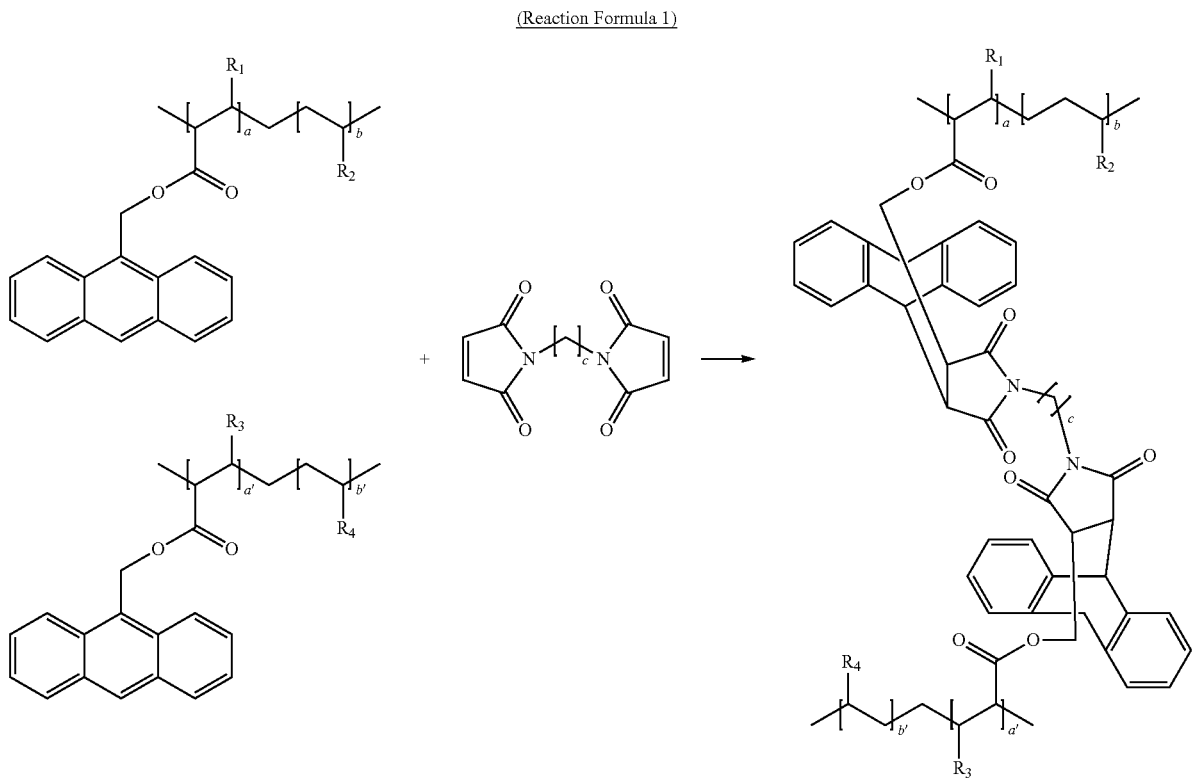

In Reaction Formula 1, each of $R_1$ and $R_3$ may be selected from the group consisting of hydrogen, hydroxyl group, ester group, amide group, and alkyl group or alkoxy group of a carbon number of 1 to 12, and each of $R_2$ and $R_4$ may be at least one selected from electrolytic functional groups. For example, each of $R_2$ and $R_4$ may be any one selected from the group consisting of functional groups in which hydrogen ions ($H^+$), sodium ions ($Na^+$), or chlorine ions ($Cl^-$) can be dissociated from $R_2$ and $R_4$. The ions may be dissociated by an electric field. Each of a, a', b, and b' is a positive integer. The ratio of b to a (b/a) may be more than 0 and less than 99, and the ratio of b' to a' (b'/a') may be more than 0 and less than 99.

A polymer for an organic dielectric may be formed by a reaction between the compounds of Formula 1 and the cross-linking agent. The polymer for an organic dielectric may be formed by a cross-linking reaction between anthracenyl groups of the compounds of Formula 1 and maleimide groups of the cross-linking agent. The cross-linking reaction may be a Diels-Alder reaction, which is one of cycloaddition reactions.

The compound of Formula 1 may be cross-linked with the cross-linking agent at relatively low temperatures. Accordingly, the organic dielectric 150 may be formed under low temperature process conditions. Thus, process stability may be enhanced.

The polymer for an organic dielectric may have electrolytic functional groups. Specifically, $R_2$ of Formula 1 and $R_2$ and/or $R_4$ of Reaction Formula 1 may function as an electrolyte in the polymer for an organic dielectric. That is, the polymer for an organic dielectric may be a polyelectrolyte. When an electric field is applied to the organic dielectric 150, the ions may be dissociated from $R_2$ or $R_4$ by the electric field. The functional groups ($R_2$, $R_4$) from which the ions are dissociated may function as electrolytes. An organic dielectric 150 including the polymer for an organic dielectric may have a high capacitance. Accordingly, driving and threshold voltages of an organic thin film transistor including the organic dielectric 150 may be lowered. Further, mechanical properties of the polymer for an organic dielectric may be also improved by a cross-linking bond between the anthracenyl group and the maleimide group. That is, an organic dielectric with its mechanical and electrical properties improved may be provided by the polymer for an organic dielectric.

A gate electrode 160 may be formed on the organic dielectric 150. The gate electrode 160 may include at least one selected from the group consisting of metal including Au, Ag, Al, and Ni, conductive metal compound including indium tin oxide (ITO), and conductive polymer including polyethylenedioxythiophene: polystyrene sulfonate (PEDOT: PSS), polypyrrole, and polyaniline. When the organic dielectric 150 has sufficiently electrolytic properties, the gate electrode 160 may be omitted.

Figure 2:
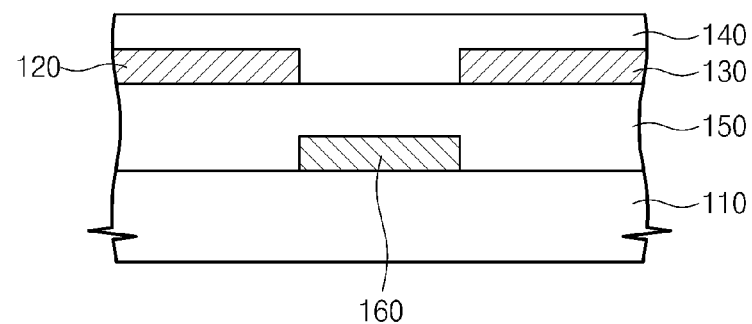
FIG. 2 is a view for explaining an organic thin film transistor according to another embodiment of the present invention.
Figure 3:
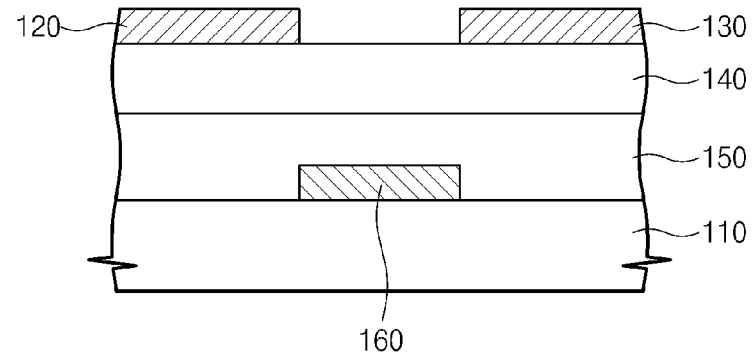
FIG. 3 is a view for explaining an organic thin film transistor according to still another embodiment of the present invention.

Referring to FIGS. 2 and 3, the positions of the substrate 110, the source electrode 120, the drain electrode 130, the active layer 140, the organic dielectric 150, and the gate electrode 160 may be variously modified.

4. Experimental Example

Figure 4:
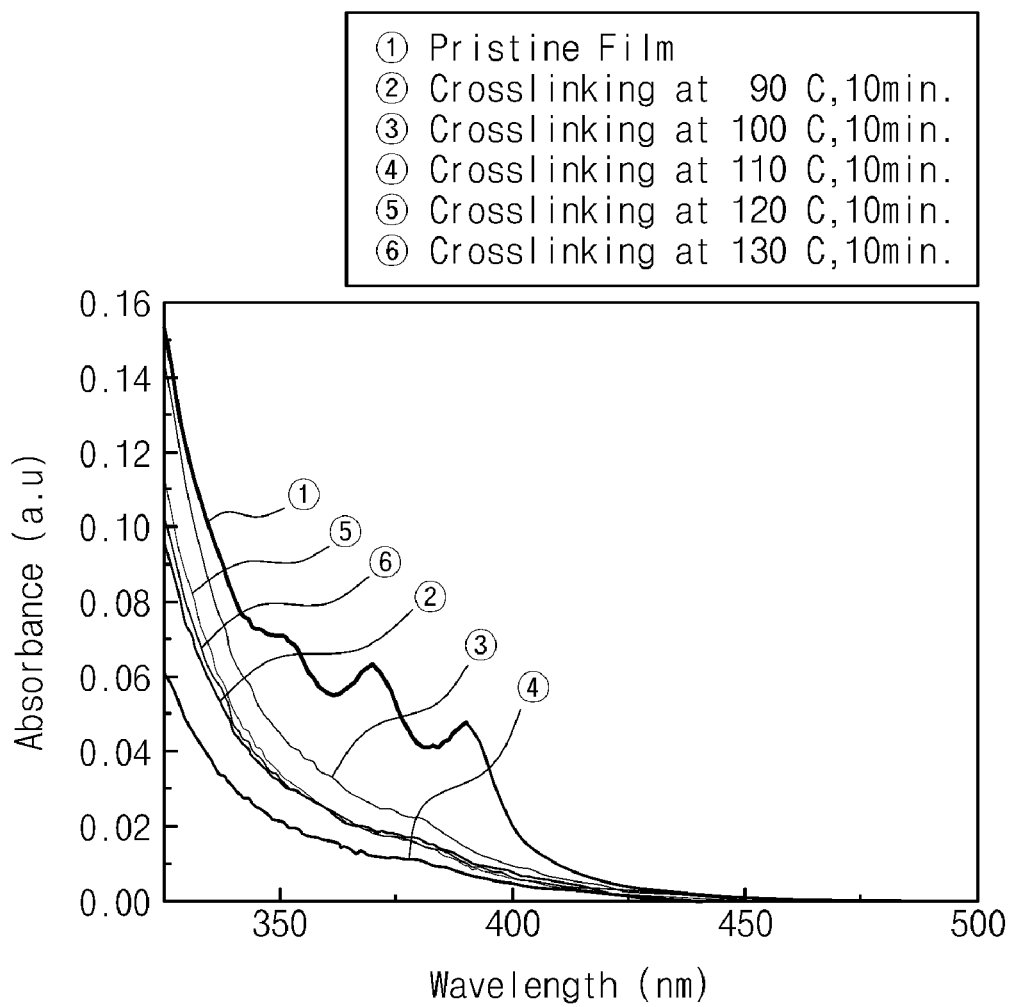
FIGS. 4 and 5 are views for explaining effects according to embodiments of the present invention.
Figure 5:
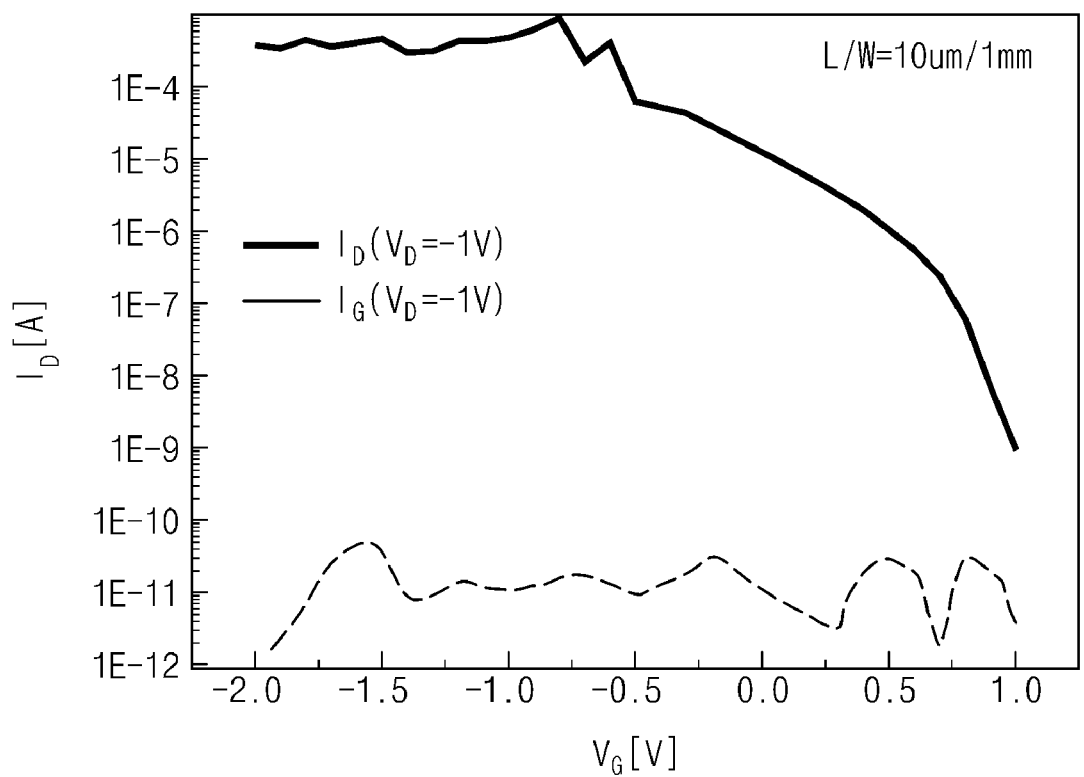

Referring to FIGS. 4 and 5, specific experimental examples and effects of embodiments of the present invention will be hereinafter described.

9-anthracenemethanol was reacted with methacryloyl chloride to synthesize anthylmethyl methacrylate (AMMA), a monomer having an anthracenyl group. The synthesized monomer having an anthracenyl group corresponds to the first monomer previously described in the method for manufacturing a composition for an organic dielectric above.

The synthesized AMMA and methylmethacrylate (MMA) were dissolved in a first organic solvent. In the Experimental Example, the MMA corresponds to the second monomer previously described in a method for manufacturing a composition for an organic dielectric, and tetrahydrofuran (THF) was used as the first organic solvent. The AMMA and the MMA were dissolved in 8 ml of THF in a ratio of 7:3 and 5:5 parts by weight. A polymerization initiator corresponding to about 0.5% by weight of the monomers was added. In the Experimental Example, 2,2-azobisisobutyronitrile (AIBN) was used as the polymerization initiator. A first mixed solution in which the AMMA, the MMA, and the AIBN were mixed was substituted by nitrogen, followed by polymerization under conditions in which the mixed solution was sealed at about 60° C. for about 20 hours. A copolymer was thereby formed in the first mixed solution. The copolymer corresponds to Formula 1 in the manufacturing method. The first mixed solution was three times precipitated in methanol which was being strongly stirred, and unreacted MMA, AMMA, and polymerization initiator were removed to separate a copolymer. Subsequently, the copolymer was dried under reduced pressure at about 60° C. for about 5 hours.

The copolymer was dissolved in a second organic solvent of THF, acetone, or chloroform in a ratio of about 4% by weight to form a second mixed solution. 1,1'-(methylenedi-4,1-phenylene)bis-maleimide (Sigma Aldrich) was added as a cross-linking agent to the second organic solvent in which the copolymer was dissolved. In the Experimental Example, the cross-linking agent was added in the same parts by weight as those by weight of the copolymer. A second mixed solution in which the cross-linking agent was added was sufficiently stirred. The copolymer and the cross-linking agent were sufficiently dissolved in the second mixed solution, followed by filtering. In the Experimental Example, the filtering was performed by using a PTFE syringe filter. As a result, a composition for an organic dielectric was formed.

The composition for an organic dielectric was applied on a substrate. In the Experimental Example, the composition for an organic dielectric was applied at about 2000 rpm for 1 min. The substrate on which the composition for an organic dielectric was applied was heated on a hot plate at a temperature of about 90° C. to about 120° C. for 10 min. A cross-linking reaction between the copolymers in the composition for an organic dielectric and the cross-linking agent was thereby conducted, and an organic dielectric was formed on the substrate.

It may be confirmed through a UV-Visible spectrum as shown in FIG. 4 whether the cross-linking reaction proceeds. Referring to FIG. 4, No. ① graph shows that three absorption peaks were produced at about 350 nm to about 400 nm caused by three rings in the anthracenyl group. When the cross-linking reaction proceeds, at least one of the three rings is cross-linked with the maleimide group of the cross-linking agent. In Nos. ②, ③, ④, ⑤, and ⑥ graphs of FIG. 4, the three absorption peaks were not produced by the three rings. That is, the graphs demonstrate that the anthracenyl group disappeared due to a cross-linking bond between the anthracenyl group and the maleimide group. The graphs also show that the cross-linking reaction may be performed even at sufficiently low temperatures.

FIG. 5 is a graph showing electrical properties of an organic dielectric according to embodiments of the present invention. The experiment was performed by using an organic thin film transistor formed as shown in FIG. 2. Specifically, source and drain electrodes 120, 130 were formed through photolithography and inkjet printing using conductive ink on a substrate 110. Poly(9,9-dioctylfluorene-co-bithiophene) (F8T2) was applied on the substrate 110 on which the source and drain electrodes 120, 130 were formed by using spin coating or inkjet printing process. An active layer 140 was thereby formed. An organic dielectric 150 was formed on the active layer 140 as in the method described in the previous Experimental Example. In the Experimental Example, the organic dielectric 150 was formed with a thickness of about 250 nm.

Referring to a dotted line in FIG. 5, the organic dielectric 150 according to the Experimental Example shows very high dielectric properties and low leakage current (less than 0.1 nA/cm$^2$) even in a thin film state. The organic dielectric 150 also has a capacitance value in the range of about 10 μF/cm$^2$ to about 100 μF/cm$^2$. The capacitance value may be controlled by controlling the ratio of the first monomer and the second monomer used in the composition for an organic dielectric. Referring to a solid line in FIG. 5, it can be seen in the organic dielectric 150 according to the Experimental Example that a device is appropriately operated at a low gate voltage of 2V or less. Further, it was confirmed that an organic thin film transistor including the organic dielectric 150 had a charge mobility of about 0.1 cm$^2$/Vs, a value significantly enhanced more than those obtained in conventional organic thin film transistors.

According to embodiments of the present invention, an organic dielectric including cross-linking bonds and having electrolytic properties may be provided. Accordingly, an organic thin film transistor including the organic dielectric may have low driving and threshold voltages. In addition, the organic dielectric may be formed by a simple process using a composition for an organic dielectric according to embodiments of the present invention. Thus, process efficiency may be improved. An organic dielectric thereby formed has improved mechanical and electrical properties. Accordingly, properties of an organic thin film transistor including the organic dielectric may be improved.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A composition for an organic dielectric, comprising:
a compound represented by Formula 1 below; and
a cross-linking agent,
wherein, in Formula 1, $R_1$ is any one of hydrogen, hydroxyl group, ester group, amide group, or alkyl group or alkoxy group of a carbon number of 1 to 12, $R_2$ is selected from the group consisting of styrene-4-sulfonic acid, sodium 4-styrene-sulfonate, phosphonic acid, and 1-4[4-(3-carboxy-4-hydroxyphenylazo)benzene-sulfonamido]-1,2-ethandiyl, each of a and b is a positive integer, and the ratio of b to a (b/a) is larger than 0 and smaller than 99, (Formula 1)

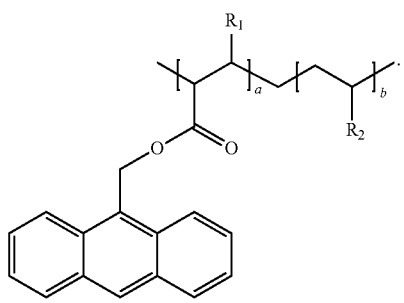

2. The composition of claim 1, wherein the cross-linking agent comprises at least one material selected from compounds comprising two or more maleimide groups.

3. The composition of claim 2, wherein the cross-linking agent comprises at least one material selected from the group consisting of Formula 2 to Formula 6 below, in which each of c, d, e, f, and g is selected from an integer of 2 to 10,

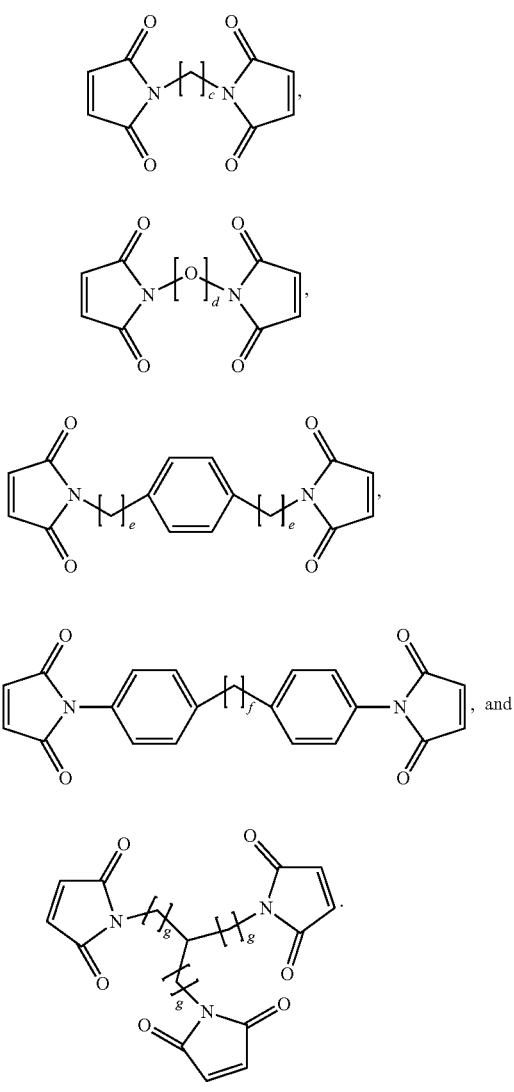

(Formula 6)

, and

4. The composition of claim 1, wherein the cross-linking agent is present in an amount ranging from about 10 parts by weight to about 100 parts by weight with respect to 100 parts by weight of the composition.

5. The composition of claim 1, further comprising an organic solvent.

6. The composition of claim 1, further comprising a polymerization initiator.

7. A composition for an organic dielectric, comprising:

a compound represented by Formula 1 below; and a cross-linking agent, wherein, in Formula 1, $R_1$ is any one of hydrogen, hydroxyl group, ester group, amide group, or alkyl group or alkoxy group of a carbon number of 1 to 12, $R_2$ is selected from electrolytic functional groups, each of a and b is a positive integer, and the ratio of b to a (b/a) is larger than 0 and smaller than 99, (Formula 1)

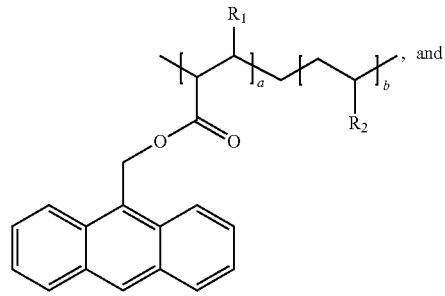

, and wherein the cross-linking agent comprises at least one material selected from the group consisting of Formula 2 to Formula 6 below, in which each of c, d, e, f, and g is selected from an integer of 2 to 10, (Formula 2)

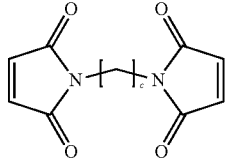

(Formula 3)

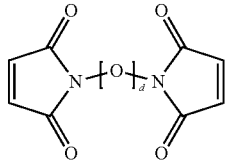

(Formula 4)

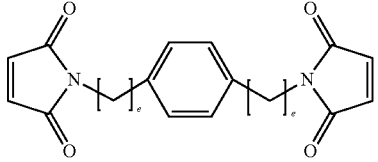

(Formula 5)

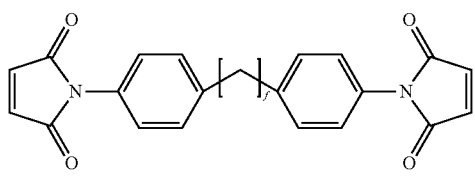

(Formula 6)

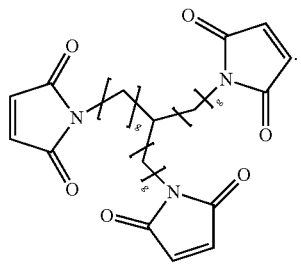

8. The composition of claim 7, wherein $R_2$ is selected from the group consisting of styrene-4-sulfonic acid, sodium 4-styrene-sulfonate, phosphonic acid, and 1-4[4-(3-carboxy-4-hydroxyphenylazo) benzene-sulfonamido]-1,2-ethandiyl.

9. The composition of claim 7, wherein the cross-linking agent is present in an amount ranging from about 10 parts by weight to about 100 parts by weight with respect to 100 parts by weight of the composition.

10. The composition of claim 7, further comprising an organic solvent.

11. The composition of claim 7, further comprising a polymerization initiator.

12. A composition for an organic dielectric, comprising:
a compound represented by Formula 1 below;
a cross-linking agent; and
a polymerization initiator,
wherein, in Formula 1, $R_1$ is any one of hydrogen, hydroxyl group, ester group, amide group, or alkyl group or alkoxy group of a carbon number of 1 to 12, $R_2$ is selected from electrolytic functional groups, each of a and b is a positive integer, and the ratio of b to a (b/a) is larger than 0 and smaller than 99, (Formula 1)

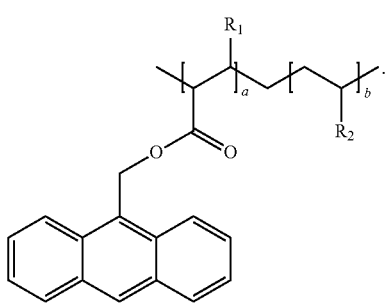

13. The composition of claim 12, wherein $R_2$ is selected from the group consisting of styrene-4-sulfonic acid, sodium 4-styrene-sulfonate, phosphonic acid, and 1-4[4-(3-carboxy-4-hydroxyphenylazo) benzene-sulfonamido]-1,2-ethandiyl.

14. The composition of claim 12, wherein the cross-linking agent comprises at least one material selected from compounds comprising two or more maleimide groups.

15. The composition of claim 14, wherein the cross-linking agent comprises at least one material selected from the group consisting of Formula 2 to Formula 6 below, in which each of c, d, e, f, and g is selected from an integer of 2 to 10, (Formula 2)

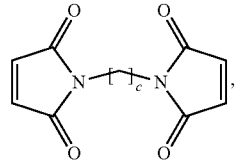

(Formula 3)

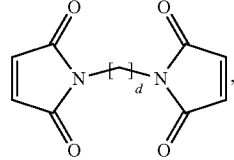

(Formula 4)

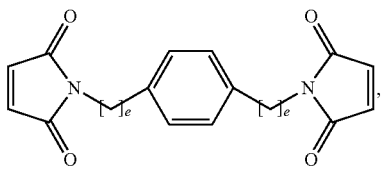

(Formula 5)

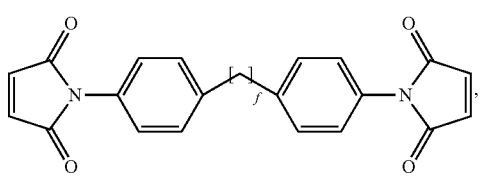

and (Formula 6)

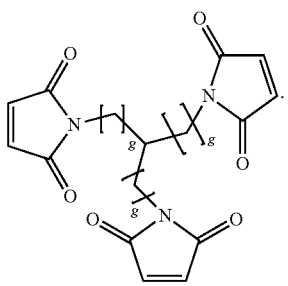

16. The composition of claim 12, wherein the cross-linking agent is present in an amount ranging from about 10 parts by weight to about 100 parts by weight with respect to 100 parts by weight of the composition.

17. The composition of claim 12, further comprising an organic solvent.

* * * * *